United States Patent
Schleiermacher et al.

(10) Patent No.: US 9,882,130 B2
(45) Date of Patent: Jan. 30, 2018

(54) APPARATUS FOR PATTERNING AN ARTICLE

(71) Applicants: Cambridge Enterprise Limited, Cambridge, Cambridgeshire (GB); Fraunhofer-Gesellschaft zur Forderung der Angewandten Forschung E.V., Freiburg (DE)

(72) Inventors: Hans-Frieder Schleiermacher, Freiburg (DE); Birger Zimmerman, Breiburg im Breisgau (DE); Michael Niggemann, Cambridge (GB)

(73) Assignees: Cambridge Enterprise Limited, Cambridge (GB); Fraunhofer-Gesellschaft zur Forderung der Angewandten Forschung E.V., Freiburg (DE)

( * ) Notice: Subject to any disclaimer, the term of this patent is extended or adjusted under 35 U.S.C. 154(b) by 335 days.

(21) Appl. No.: 14/700,944

(22) Filed: Apr. 30, 2015

(65) Prior Publication Data
US 2015/0263287 A1     Sep. 17, 2015

Related U.S. Application Data

(62) Division of application No. 13/808,268, filed as application No. PCT/GB2011/051259 on Jul. 4, 2011, now Pat. No. 9,048,372.

(30) Foreign Application Priority Data

Jul. 5, 2010    (GB) .................................. 1011282.9

(51) Int. Cl.
*H01L 51/00*    (2006.01)
*H01L 21/311*   (2006.01)
(Continued)

(52) U.S. Cl.
CPC .......... *H01L 51/0017* (2013.01); *B82Y 10/00* (2013.01); *C23F 1/02* (2013.01);
(Continued)

(58) Field of Classification Search
CPC ....... B05C 5/0216; B05C 1/14; B05C 11/026; H01L 51/0017; H01L 21/32134;
(Continued)

(56) References Cited

U.S. PATENT DOCUMENTS 3,770,539 A  * 11/1973  Bullock .................. B29C 70/08
                                                                156/155
4,343,662 A     8/1982  Gray
(Continued)

FOREIGN PATENT DOCUMENTS

EP     1695398     11/2009
JP     02-042766   2/1990
(Continued)

*Primary Examiner* — Laura Edwards
(74) *Attorney, Agent, or Firm* — Hartman Global IP Law; Gary M. Hartman; Domenica N.S. Hartman

(57) ABSTRACT

An apparatus for patterning an article that comprises a first layer of a first material. The apparatus includes a thread, at least one thread guide for guiding the thread such that at least a portion of the thread engages with the article, a unit for moving the thread relative to the at least one thread guide means, and a unit for applying a solvent to the thread before the thread contacts the article, wherein the first material is soluble in the solvent.

33 Claims, 6 Drawing Sheets

(51) Int. Cl.
   *H01L 21/3213* (2006.01)
   *B82Y 10/00* (2011.01)
   *H01L 31/18* (2006.01)
   *C23F 1/02* (2006.01)
   *C23F 1/00* (2006.01)
   *B05C 5/02* (2006.01)
   *B05C 11/02* (2006.01)
   *H01L 51/42* (2006.01)

(52) U.S. Cl.
   CPC .. *H01L 21/31111* (2013.01); *H01L 21/32134* (2013.01); *H01L 31/18* (2013.01); *H01L 51/0007* (2013.01); *H01L 51/0019* (2013.01); *B05C 5/0216* (2013.01); *B05C 11/026* (2013.01); *C23F 1/00* (2013.01); *H01L 51/0036* (2013.01); *H01L 51/0037* (2013.01); *H01L 51/0047* (2013.01); *H01L 51/4253* (2013.01)

(58) Field of Classification Search
   CPC ............... H01L 21/31111; H01L 31/18; H01L 51/0019; H01L 51/0007; H01L 51/0047; H01L 51/4253; H01L 51/0037; H01L 51/0036; C23C 16/54; C23C 16/545; C23F 1/02; C23F 1/00; B82Y 10/00; H05K 3/0085

USPC ......... 118/257, 106; 51/307, 309; 156/345.2
   See application file for complete search history.

(56) References Cited

U.S. PATENT DOCUMENTS

| | | | |
   |---|---|---|---|
   | 4,398,994 | A | 8/1983 | Beckett |
   | 4,610,775 | A | 9/1986 | Phifer |
   | 4,869,778 | A | 9/1989 | Cote |
   | 6,547,920 | B2 * | 4/2003 | Gatica .................. G02B 6/245 |
   | | | | 118/420 |
   | 2003/0221718 | A1 | 12/2003 | Kubo et al. |
   | 2005/0129977 | A1 | 6/2005 | Poon et al. |
   | 2005/0185336 | A1 | 8/2005 | Chen et al. |
   | 2006/0202612 | A1 | 9/2006 | Poon et al. |
   | 2007/0200489 | A1 | 8/2007 | Poon et al. |

FOREIGN PATENT DOCUMENTS

| | | |
   |---|---|---|
   | JP | 2000-340811 | 12/2000 |
   | JP | 2003-303981 | 10/2003 |
   | WO | 2007-089406 | 8/2007 |

* cited by examiner

APPARATUS FOR PATTERNING AN ARTICLE

CROSS REFERENCE TO RELATED APPLICATIONS

This is a division patent application of U.S. patent application Ser. No. 13/808,268, filed Apr. 18, 2013, now issued as U.S. Pat. No. 9,048,372. The contents of this prior application are incorporated herein by reference.

BACKGROUND OF THE INVENTION

The present invention relates to methods and apparatus for patterning articles such as electronic, e.g. photovoltaic devices and methods and apparatus for their construction.

Electronic devices such as photovoltaic thin film modules consist of functional layers of a defined geometry that are positioned with respect to one another such that a photovoltaic module is formed. These functional layers are typically charge carrier extraction layers, photoactive layers for accepting electromagnetic radiation and outputting electrical energy and electrode layers.

A photovoltaic module consists of a number of individual photovoltaic cells connected together. These individual cells may be connected in series or in parallel to each other. Higher output voltages may typically be achieved by electrically connecting the cells in series.

Photovoltaic modules such as thin film photovoltaic modules are sometimes fabricated as a monolithic array of cells. Rather than wiring individual cells together (as is sometimes performed for, say, crystalline solar modules), the monolithic interconnection of thin film modules may be achieved either by producing a substrate substantially covered by the necessary functional layers and patterning those functional layers to produce a network of individual cells on the substrate or by directly printing the functional layers to the substrate in the desired pattern.

As is clear to the skilled person, the relative ease of manufacture of a monolithic module provides a cheaper alternative to electrically connecting an array of individual wafers. However, known methods for producing monolithic arrays have limitations which may have a detrimental effect on the quality of finished photovoltaic modules.

In order to maximise the power conversion efficiency of photovoltaic modules, it is necessary to ensure a high homogeneity of the film thickness, that thickness usually being in the order of ten to several hundred nanometers for the photoactive layer of organic photovoltaic cells and in the order of microns for inorganic thin film cells, and a high resolution edge definition.

Printing techniques such as gravure printing enable the deposition of a patterned thin film in a single process step. However, not all layers of a device can be deposited by printing techniques. For example, some vacuum deposited transparent electrodes (ITO) or highly reflective metal electrodes may not be deposited by printing techniques. The highest film quality with regard to a high homogeneity and a low defect density (pinholes) is likely to be achieved by coating techniques rather than by printing techniques like gravure printing. Due to the low solid content of the solutions caused by the limited solubility of some of the components, the cell volumes in the gravure structure of printing cylinders must be relatively large to produce functional layers of the required thickness. High cell volumes result in large cells in the order of several tens of micrometers, meaning that the edge resolution of gravure to non-gravure areas is limited. As a consequence the formation of straight uniform printing edges on the order of micrometers is unlikely. In addition, the thickness of a printed area will always vary starting from the edge towards the centre of the printed layer. The length of this variation depends on the rheological properties of the material, the drying conditions and the surface tension of the substrate. A deviation from the optimum film thickness will result in lower power conversion efficiencies and is therefore unfavourable. Accordingly, coating or otherwise providing large areas will lead to a greater degree of homogeneity in a finished article.

Coating techniques such as slot-die coating or blade coating typically offer highly uniform functional layers. However these layers are either not patterned or include patterning with coarse resolutions, e.g. requiring mm scales for stable gap sizes in the slot-die coating process. Thus post-processing is usually required to produce the required array of cells on the substrate.

Further, patterning steps include laser scribing which may be useful for patterning organic and inorganic layers in e.g. organic solar cell modules.

Laser scribing uses one or more lasers to ablate the functional layers of the substrate to create the desired pattern. However, typically the laser ablates all of the functional layers on the substrate (and might also damage or otherwise affect the substrate), where it may actually be desired to ablate only one or some of the layers.

While the selective patterning of only certain layers by laser scribing is possible, it relies, particularly when the layers are thin, upon the individual layers having sufficiently distinct absorption characteristics and the according use of lasers of different wavelengths to ablate each layer. Moreover, lasers are likely to damage the underlaying barrier layers (for example layers of SiN, $Al_2O_3$ or $SiO_2$ between the substrate and electrode), and the equipment is relatively expensive, especially where a plurality of lasers (or indeed tunable lasers) are required.

Mechanical scribing, such as the use of hardened steel tips to remove layers from a thin film, is also used to pattern, e.g., inorganic thin film modules and organic photovoltaic modules. However significant disadvantages include the destruction of underlying surfaces, remaining traces of organic components (which may be critical in areas that will be utilized for electrical interconnects, as a subsequently coated electrode layer may suffer from a high electrical interface resistance caused by partially removed organic layers), and the production of particles that may cause damage in the subsequent deposition and encapsulation processes.

BRIEF DESCRIPTION OF THE INVENTION

The present invention addresses these issues by providing a method and means for patterning a substrate coated with one or more functional layers.

In a first aspect, the invention provides a method for patterning an article, the article comprising a first layer of a first material, the method comprising providing a thread carrying a first species, e.g. a solvent in which the first material is soluble, and contacting the thread with the first layer to remove at least part of the first layer.

In this specification, the term "thread" refers to continuous elongate flexible members having a free cross sectional aspect ratio between 0.6 and 1.4, e.g. 0.7 and 1.3, say 0.8 and 1.2 or 0.9 and 1.1, preferably 1 or values between the upper and lower limits.

Whilst reference is made to the first layer, it will be appreciated that the 'first' layer of the article need not be the uppermost layer. For example, in a vertical stack of layers, the uppermost (or any succeeding) layer may be removed by any technique and the method above deployed to remove a portion of the newly exposed layer.

In this context the term "continuous" means that the thread has a length substantially greater than the intended or actual contact length of the thread with the surface in use, for example, 2, 3, 4, 5 or 10 or more times the length of the thread contact length with the surface in use. The length of the threads is likely in the range of meters, to thousands of meters in order to provide a sufficiently clean reservoir for efficient removal of the dissolved material. Alternatively the thread can form a continuous or endless loop. An endless loop configuration may require continuous cleaning of the thread, say by a downstream bath, scraping means or other cleaning apparatus.

The thread may have a thickness (e.g. diameter) of from 1 to 500 μm, say from 10 to 200 μm, for example 30 to 100 μm. Other larger (e.g. up to 10 mm), smaller or other specific intervening thicknesses may be used.

The inventors have found that, by using threads to define patterns onto articles, e.g. layers of electronic devices or their precursors, a high degree of accuracy and uniformity in the edges so produced is afforded. In particular, the resolution of a thread compared to say a flat, ribbon or tape-like structure is higher. Also, a thread has a high volume per unit length compared to, say, a flat ribbon-like structure, which provides effective means for carrying solvent and for carrying, e.g. wicking, the first material away from the surface of the article. This provides clean and effective removal of the first material.

Moreover, the use of threads allows the provision of very straight and very narrow channels (say in the order of 50 μm to 500 μm) into the layers of e.g. a precursor for an electronic device, thereby providing an effective technique for the production of large arrays of series connected devices.

The shape of a thread and/or the way it is applied to a surface may also lead to other edge advantages, as will be discussed below.

Preferably, a first major surface of the first layer is adjacent, e.g. in intimate contact with, some or all of a first major surface of a second layer of a second material, the first material having a relatively high solubility in the or a first solvent and the second material having a relatively low solubility in the first solvent Preferably, the first layer comprises a hole collection compound and the first solvent comprises a solvent or solvent mixture suitable for solvating the hole collection compound, e.g. isopropanol, ethanol and/or water.

Preferably, the first layer comprises a photoactive compound and the first solvent comprises a solvent or solvent mixture suitable for solvating the photoactive compound, e.g. xylene and/or toluene.

Preferably, the second layer comprises a photoactive layer and the first solvent comprises a solvent or solvent mixture suitable for solvating the or a hole collection compound, e.g. isopropanol, ethanol and/or water.

Preferably, the second layer comprises a hole collection compound and the first solvent comprises a solvent or solvent mixture suitable for solvating the or a photoactive compound, e.g. xylene and/or toluene.

Solvents may be polar or non-polar and may be selected according to the solubility requirements of the individual compound or compounds in each layer. Solvents may include hydrogen bonding solvents such as water, non-polar solvents such as xylene or toluene, and polar solvents such as alcohols (e.g. isopropanol, ethanol, methanol and the like), ketones (e.g. acetone, methyl ethyl ketone, etc.), acetates, ethers, alkyl halides (e.g. methylene chloride).

In some embodiments, the method further comprises providing a thread carrying a plurality of species, e.g. two solvents, and bringing the thread into contact with the article to remove a plurality of layers.

Preferably, the method comprises moving the thread in its axial direction relative to the device or precursor during contact with the first layer.

Preferably, the speed of movement of the thread relative the device or precursor is between 0 m/min and 1000 m/min.

Preferably, the device or precursor is moved in the same direction as the thread during contact therewith.

Alternatively, the device or precursor is moved in the opposite direction to the thread during contact therewith.

Preferably, the thread, in its free state, has a regular, e.g. substantially circular, elliptical, oval, triangular, rectangular, square, oblong, pentagonal or hexagonal or irregular cross sectional profile.

Preferably, the method is performed as at least part of a continuous, preferably automatic, process.

In some embodiments, the method comprises providing one or more further threads, each of said further threads carrying the first species, the or each further threads extending in parallel spaced relations and contacting the first layer with the thread and further threads.

In a further aspect, the invention provides an apparatus for patterning a surface, the apparatus comprising a thread and a movable guide, the movable guide comprising means for guiding the thread such that at least a portion of the thickness of the thread stands proud of said means, wherein the apparatus comprises means for moving the thread relative to the guiding means.

Preferably, the moving means comprises a movement means for moving the thread in a lengthwise direction.

In another aspect, the invention provides an apparatus for patterning an electronic device, the apparatus comprising a first thread and at least two movable guides for mounting the first thread and providing a region of the first thread for contacting an article.

Preferably, the article is a web of material and the apparatus further comprises a roll to guide or capable of guiding the web thereabout.

Preferably, the guides are operable to bring the thread into contact with the web as the web is guided about the roll.

Preferably, the first and second movable guides comprise rollers for moving the first thread in lengthwise direction.

Preferably, the apparatus comprises means for applying a substance to the thread before it contacts an article.

In some embodiments, the apparatus comprises one or more further threads, each of said further threads carrying the first species, the or each further threads extending in parallel spaced relations for contacting a layer at one or more respective parallel spaced locations.

In a further aspect, the invention provides an electronic device comprising a first layer and a second layer, mounted successively on a further layer, both the first and second layer having a channel formed therein, the channel of the first layer being narrower than, and bounded by, the channel in the second layer, a portion of a major surface of the first layer being exposed at each side of the first layer channel.

In a further aspect, the invention provides an array of electronic devices as described above.

BRIEF DESCRIPTION OF THE DRAWINGS

The invention will now be described by way or example only and with reference to the following drawings.

DETAILED DESCRIPTION OF THE INVENTION

Figure 1A:
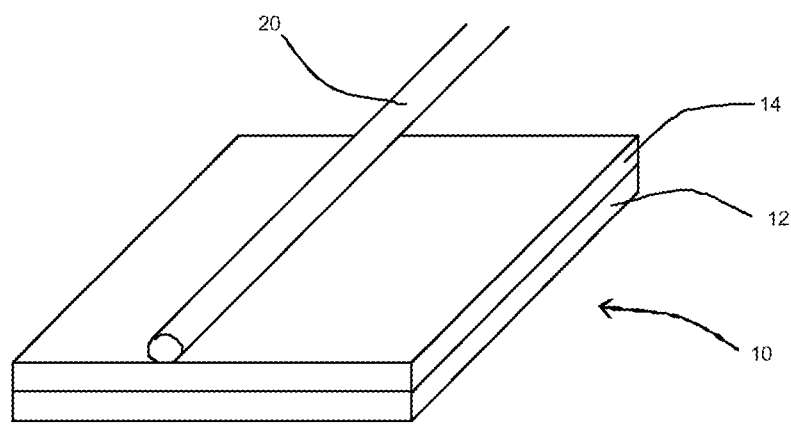
FIGS. 1A and 1B show steps of a method according to the invention.
Figure 1B:
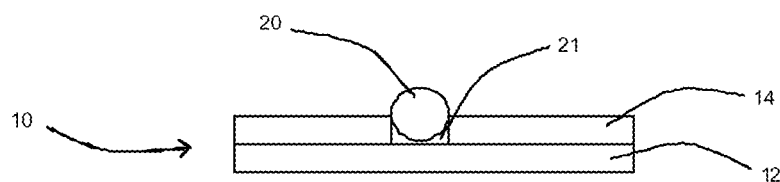
Figure 2:
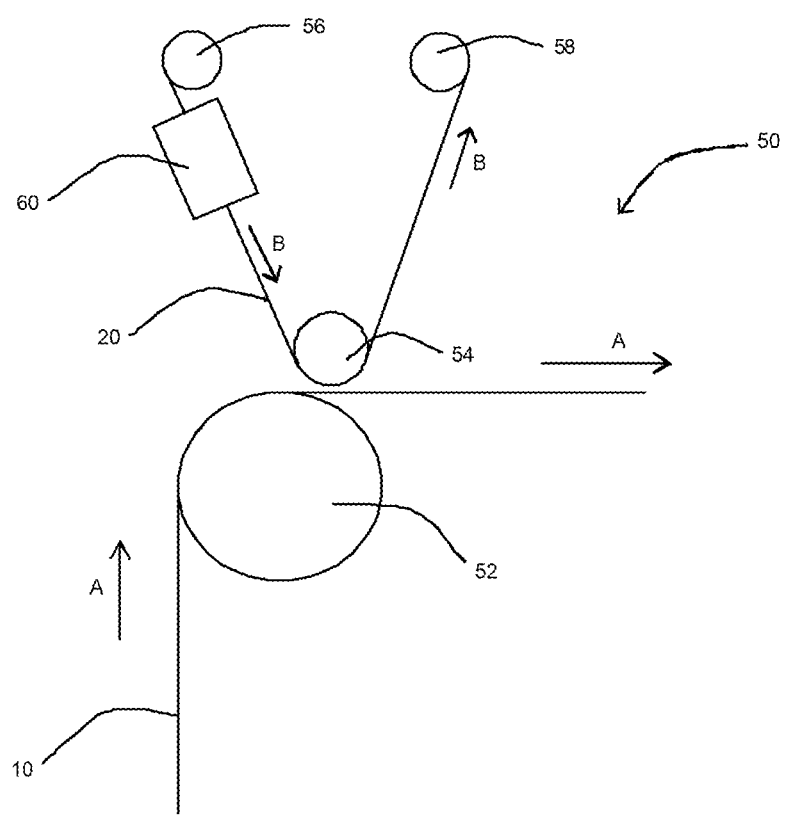
FIG. 2 is a drawing of apparatus according to the invention.

A first embodiment of the invention is shown in FIGS. 1A, 1B and 2. FIG. 1A shows a web 10 comprising a substrate 12 having a layer of first material 14 (e.g. a hole collection material) applied thereto.

In order to remove a well defined narrow, well resolved, portion of the layer of first material 14 from the web 10, a thread 20 is provided. The thread is formed from e.g. cotton or polyester and is saturated with a solvent capable of solvating the first material 14 (as the solvent may be one or more or water, isopropanol or ethanol, if the first material 14 is a hole collection material).

The thread 20 in its free, natural or equilibrium state is of substantially circular cross section and has a diameter typically, in the range of from 1 to 500 μm across, e.g. 20 to 150 μm and has a length of about 10 to several thousand m when provided for roll-to-roll deployment or in a continuous loop.

The thread 20 is contacted with the surface of the layer of first material 14 and dragged thereacross in its axial direction. The solvent on the thread 20 solvates the first material 14 in the vicinity of the thread 20, creating a channel 21 therein.

The width of the thread 20 is such that a narrow passageway or channel 21 is formed. The thread 20 can be sized to provide a high resolution, easily comparable or, indeed, is able to exceed that or laser or mechanical scribing.

The wiping procedure can be separated into the following three steps:

1) The thread provides a sufficient amount of material, e.g. solvent or liquid to remove, e.g. dissolve or etch the respective layer while the thread is in contact with the thin film.
2) A relative speed between the thread and the web combined with a force of the thread normal to the web surface causes a shear force in the contact area. This shear force is useful in some embodiments to enhance the wiping procedure.
3) The dissolved material is carried away by the thread by surface effects, a wicking effect or a combination of the same or other effects.

A thread is chosen in order to provide a sufficient amount of solvent (1.), the high volume per unit length of the thread 20, compared to, say, a flat ribbon-like structure, provides a large reservoir of solvent and an effective reservoir for accepting (for example by capillary action or wicking) the first material 14 dissolved in the solvent and allowing it to move away from the surface of the substrate 12. Because of the relatively large volume per unit length the opportunity for a high volume of solvent or any other liquid provided per unit linear length of the thread to be established at the contacting surface of the thread is increased when compared to a flat-ribbon like structure. As will be discussed below, the solvent or liquid capacity of the thread can be changed by applying specific forces to the thread. This effect can be utilized in order to 1.) provide sufficient solvent, 2.) release solvent during the dissolution phase and 3.) wick the dissolved material from the surface.

This provides a clean and effective removal of the first material 14 and therefore excellent resolution of the channel 21.

Referring to FIG. 2, there is provided a first apparatus 50 for performing the method of the invention. The web 10 is conveyed over a roller 52 in a direction A. Adjacent the roller 52 is provided a movable roller 54, which comprises a groove (not shown) around its circumference. The pressure and therefore the shear force can be adjusted via a spring that is mounted to a lever. The groove is sized so as to receive and guide a thread 20, which is spooled around the circumference of the movable roller 54 by a first bobbin 56 and a second bobbin 58, such that a portion (e.g. at least half, or less than half) of the thickness of the thread 20 is proud of the groove for engagement with the surface of the layer of first material 14.

A bath 60 is provided between the first bobbin 56 and the movable roller 54 to apply solvent or other materials to the thread 20.

In use, the thread 20 is wound in a direction B from the first bobbin 56, through the chemical bath 60, around the movable roller 54 and onto the second bobbin 58. The movable roller 54 is moved towards the web 10 so as to engage the thread 20 with the web 10 to remove at least a portion of the layer of first material 14. The speed of movement of the thread in direction B may be adjusted in order to obtain optimal patterning results.

Figure 5:
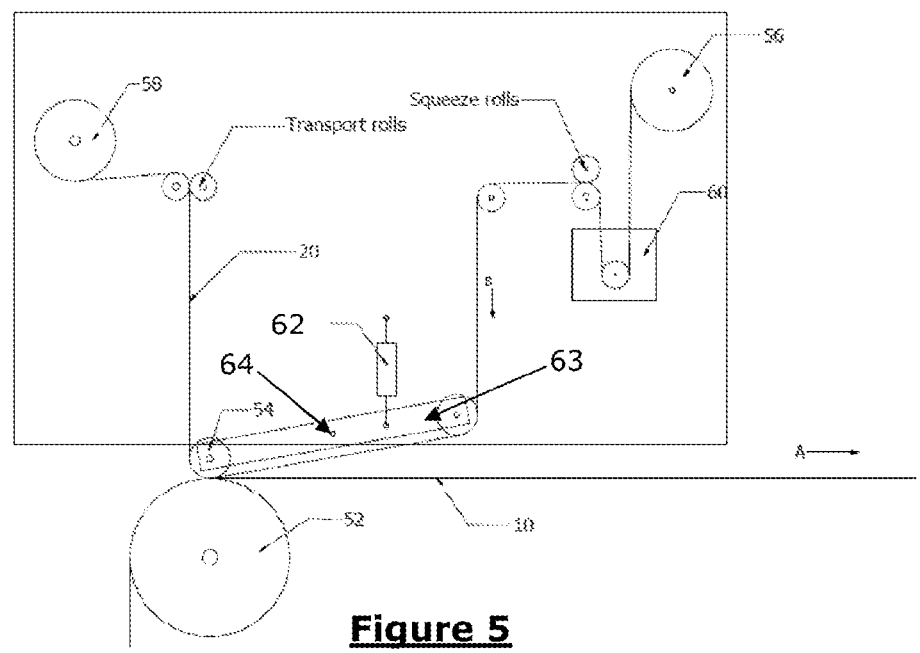
FIG. 5 is a drawing of a second embodiment of apparatus according to the invention.

A more complete version of the above-discussed system is shown in FIG. 5 (like components having the same identifying numerals for ease of reference).

The spring 62 is shown which provides means to allow adjustment of the contact pressure of the thread 20 with the substrate 10. The tension in the spring 62 can be adjusted such that the lever 63 is rotatable about the pivot point 64. This may occur automatically to ensure accurate control of the contact between substrate 10 and thread 20.

Of course, other amendments may be made to the equipment to ensure control of the pressure applied by the thread to the web 10, such as providing means to reciprocate the roller 54 in the vertical plane.

Figure 3A:
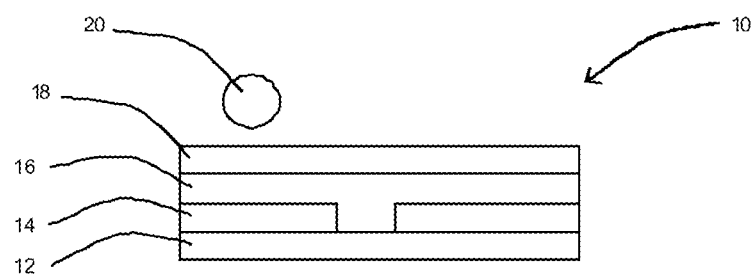
FIGS. 3A and 3B show steps of a method according to the invention.
Figure 3B:
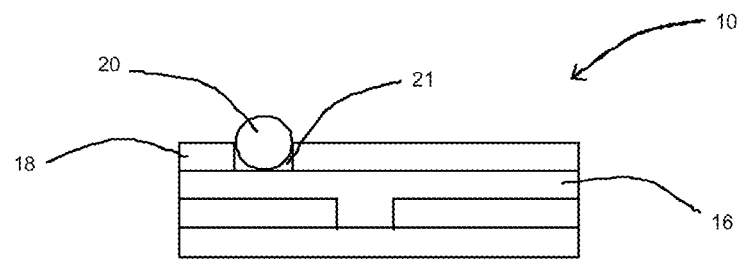

A second embodiment of the invention is shown in FIGS. 3A and 3B. FIG. 3A shows part of a web 10 comprising a substrate 12 having applied to its surface in series an electrode layer 14, a photoactive layer 16 and a transparent hole collection layer 18.

The electrode layer 14 may comprise a metal layer such as chromium or aluminium. The electrode layer 14 may also be a transparent layer, for example comprising indium tin oxide, or some other a metal-oxide/metal/metal-oxide layer system coated with a specific oxide providing an ohmic contact for efficient electron injection. Such specific contact could be formed from $TiO_x$ or $ZnO_x$ (either doped or intrinsic) deposited by vacuum processing or as sol-gel or nanoparticle from solution.

The photoactive layer may be a blend of a conjugated polymer and a fullerene derivative such as a blend of poly (3-hexylthiophene) (P3HT) and [6,6]-phenyl C61-butyric acid methylester (PCBM). P3HT, the main absorber in this photoactive composite has a band gap of around 2.1 eV and absorbs wavelengths of up to around 650 nm.

Alternatively, the photoactive layer may comprise a blend of two conjugated polymers one presenting the donor and one the acceptor. Other suitable photoactive layers may comprise: p-phenylenevinylene-based 5 conjugated polymers such as (poly(2-methoxy-5-((3',7'-dimethyloctyl)oxy))-1,4-phenylenevinylene) (MDMO-PPV,); fluorene-based conjugated polymers, e.g. 2,1,3-benzothiadiazole-containing PF, poly (9,9-dioctylfluorene-2,7-diyl-alt-4,7-bis(3-hexylthien-5-yl)-2,1,3-benzothiadiazole-2','2-diyl).

The hole collection layer 18 comprises a hole collection compound such as poly(3,4-ethylenedioxythiophene)-poly(styrene sulfonate) ((PEDOT)-PSS) or polyaniline-poly(styrene sulfonate) (Pani). Alternative hole collection compounds include metal oxides such as $MoO_3$, NiO, or $V_2O_5$.

In order to remove a well defined narrow portion of a thin coated film of the web 10, a thread 20 is provided. The thread is formed from e.g. cotton or polyester and is saturated with a solvent such as water, isopropanol or ethanol, in which the photoactive layer 16 has a relatively low solubility as compared to the hole collection layer 18.

The thread 20 is contacted with the surface of the hole collection layer 18 and dragged thereacross in its axial direction. The solvent on the thread 20 solvates the hole collection layer 18 in the vicinity of the thread 20, creating a channel 21 therein. However, because of the relatively low solubility of the photoactive layer 16 in the solvent on the thread 20, little or none of the photoactive layer 16 is removed, as is shown in FIG. 3B, thereby affording the method excellent specificity in its patterning.

Figure 4:
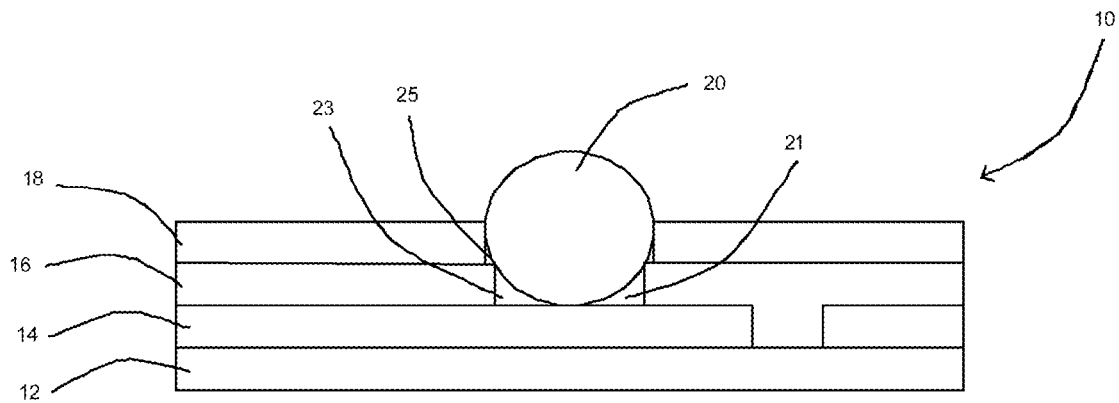
FIG. 4 is a drawing of a device formed in accordance with a method of the invention.

A further embodiment of the invention is shown in FIG. 4. A web 10 similar to that described in relation to FIGS. 3A and 3B, above, was contacted with a thread 20 to remove a channel 21 through both the photoactive layer 16 and the transparent hole collection layer 18.

This was achieved by applying an appropriate solvent mixture, for example a mixture of xylene and isopropanol to the thread 20 to ensure effective solvation of both layers during the patterning operation.

The pressure distribution across the thread 20 in contact with the web 10 provides for a narrower section 23 of the channel 21 in the photoactive layer 16 and a wider section 25 of the channel 21 in the transparent hole collection layer 18. The pressure distribution, which will usually provide the highest pressure underneath the centre of the thread and a reduced pressure at or towards the sides of the thread can provide a stepped or sloped arrangement on the sides of the channel 21 and reduces the opportunity for short circuits between the hole collection layer 18 and the electrode layer 14, thereby improving the integrity of the resultant device.

Figure 6:
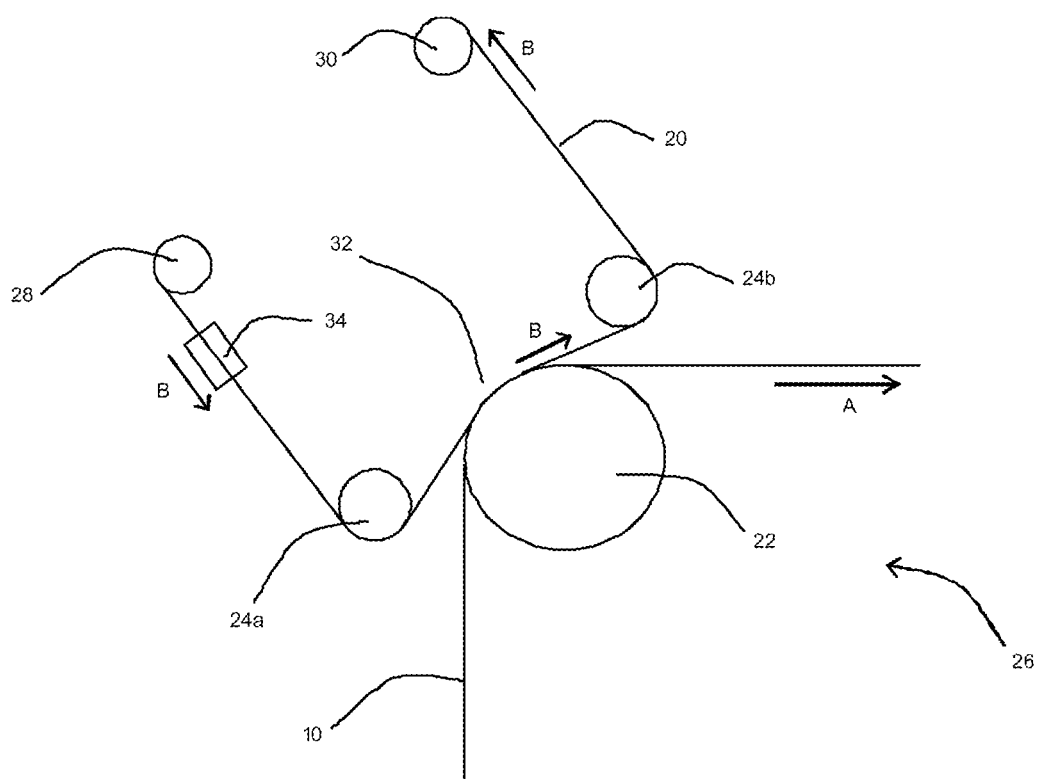
FIG. 6 is a drawing of third apparatus according to the invention.

FIG. 6 provides a further example of apparatus of the invention. There is shown a system similar to that shown in FIG. 2, adapted to pattern a web 10 using a thread 20. The web 10 is conveyed over a roller 22 in a direction A.

Meanwhile, the thread 20 is loaded onto a pair of movable rollers 24a, 24b, such that it can be unwound from a first bobbin 28, pass around the first movable roller 24a, and then around the second movable roller 24b, leaving a section 32 of thread therebetween for contacting the web 10, before finally being wound onto a second bobbin 30. The thread is wound in a second direction B at a second speed s, preferably being greater than first speed v.

A chemical bath 34 is positioned between the first bobbin 28 and the first movable roller 24a to apply solvent to the thread 20.

In use, the web 10 is passed across the roller 22 in direction A at speed v and the thread 20 is wound across the movable rollers 24a, 24b in direction B at speed s. Solvent is introduced to the thread by chemical bath 34. The movable rollers 24a, 24b are actuated to bring the moving thread into contact with the web 10 at the point that it passes over the roller 22.

The thread 20 thus creates a channel 21 one or more layers, e.g. in the hole collection layer 18 by solvation of the layer 18.

Figure 7:
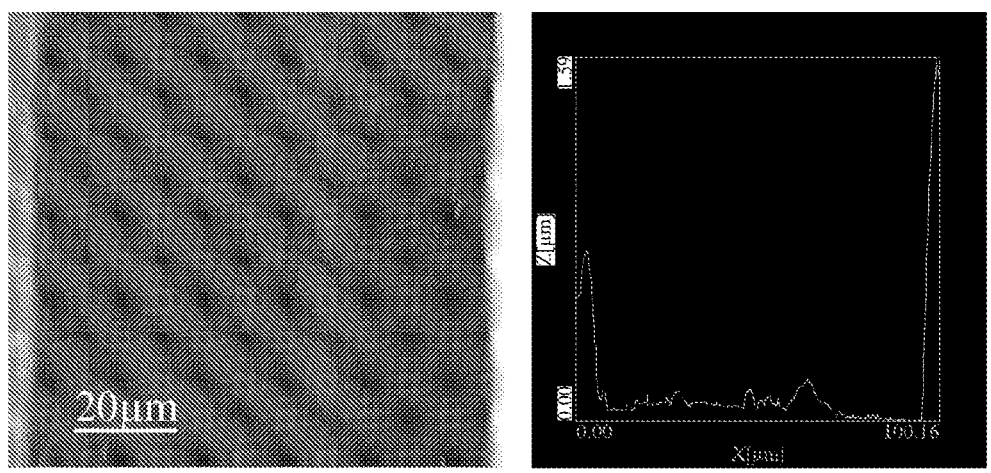
FIG. 7 shows an article formed using methods of the invention.

Referring now to FIG. 7, there is shown an example of a patterned line in a photoactive layer. AFM measurements on the obtained structures show groove widths of 90 micrometers with well defined edges.

No doubt many other effective alternatives will occur to the skilled person. For example, while the embodiments described above are primarily concerned with the use of threads carrying solvents such as toluene, xylene, chlorobenzene and alcohols to assist in the removal of organic species from a web, other functions for the threads are envisaged.

Metal electrodes, such as aluminium, gold, silver, chromium and copper electrodes, and conducting e.g. transparent oxide electrodes such as indium tin oxide and aluminium doped zinc oxide, may be etched using the above described methods utilising threads carrying specific acid or base solutions.

Self assembled monolayers may be applied to the surface of substrates, for example to alter the surface energy thereof, by utilising threads carrying suitable species, such as haloalkylsilanes including octyl-trichlorosilane.

In further embodiments, the threads may be used to abrade layers from the surface of substrates. Such abrasive threads may, for example, be coated with and/or carry abrasive slurries. These may be used in place of solvents and the invention may be construed as such. Etchants as well as abrasives may be used. One or more removal species may be provided on the thread.

In some embodiments, the process and/or apparatus may be used to manufacture an array of electronic devices, for example by providing a plurality of parallel and spaced threads to etch a large web of material.

It will be understood that the invention is not limited to the described embodiments and encompasses modifications apparent to those skilled in the art lying within the spirit and scope of the claims appended hereto.

The current invention has applicability to both the 'standard' and 'inverted' structure of PV cells. The skilled person will be able to choose appropriate materials to remove one or more layers from each type of structure.

Of course, as would be understood by one skilled in the art, changes to the operation of the system 26 shown in FIG. 6 (or that shown in FIG. 5 or 2) may offer different finishing effects. For example, it is preferred that the speed s of the movement of the thread 20 in direction B is greater than the speed v of the movement of web 10 in the direction A, so as to carry dissolved matter away from the web 10. However, it is envisaged that the speed s and the speed v could be the same or that the speed s could be smaller than the speed v. In other preferred embodiments, the directions A and B could be opposing at the point of contact between the thread 20 and the web 10. In most embodiments a contra-flowing motion is preferred. Of course, this may necessitate moving the position of the baths such that the baths are upstream of the contact area.

The invention claimed is:

1. An apparatus for patterning an article comprising a first layer of a first material, the apparatus comprising:
   a thread;
   at least one thread guide means for:
      guiding the thread such that at least a portion of the thread engages with the article to remove at least part of the first material of the first layer; and
      guiding the thread so that the thread disengages from the article;
   means for moving the thread relative to the at least one thread guide means; and
   means for applying a solvent to the thread before the thread contacts the article, the first material being soluble in the solvent.

2. The apparatus according to claim 1, wherein the at least one thread guide means is operable to bring the thread into contact with the article.

3. The apparatus according to claim 1, wherein the article is a web of material and the apparatus further comprises a web guide means capable of guiding the web thereabout.

4. The apparatus according to claim 3, wherein the web guide means comprises a roller.

5. The apparatus according to claim 3, wherein the at least one thread guide means is operable to bring the thread into contact with the web as the web is guided about the web guide means.

6. The apparatus according to claim 1, wherein the at least one thread guide means for guiding the thread comprises a groove sized so as to receive and guide the thread.

7. The apparatus according to claim 1, wherein the means for applying a solvent to the thread comprises a bath comprising the solvent.

8. The apparatus according to claim 1, wherein the thread is formed from cotton or polyester.

9. The apparatus according to claim 1, wherein the thread contains the solvent.

10. The apparatus according to claim 1 further comprising one or more further threads extending in parallel spaced relations for contacting the first layer at one or more respective parallel spaced locations.

11. The apparatus according to claim 1, wherein the thread is guided over the article and there is relative movement between the thread and the article.

12. An apparatus for patterning an article comprising a first layer of a first material, the apparatus comprising:
   a thread;
   a thread guide means for:
      guiding the thread such that at least a portion of a thickness of the thread protrudes from the thread guide means for engagement with the article, such that the thread removes at least part of the first material of the first layer; and
      guiding the thread so that the thread disengages from the article;
   means for moving the thread relative to the thread guide means; and
   means for applying a solvent to the thread before the thread contacts the article, the first material being soluble in the solvent.

13. The apparatus according to claim 12, wherein the thread guide means is operable to bring the thread into contact with the article.

14. The apparatus according to claim 12, wherein the article is a web of material and the apparatus further comprises a web guide means capable of guiding the web thereabout.

15. The apparatus according to claim 14, wherein the web guide means comprises a roller.

16. The apparatus according to claim 14, wherein the at least one thread guide means is operable to bring the thread into contact with the web as the web is guided about the web guide means.

17. The apparatus according to claim 12, wherein the thread guide means for guiding the thread comprises a groove sized so as to receive and guide the thread.

18. The apparatus according to claim 12, wherein the means for applying a solvent to the thread comprises a bath comprising the solvent.

19. The apparatus according to claim 12, wherein the thread is formed from cotton or polyester.

20. The apparatus according to claim 12, wherein the thread contains the solvent.

21. The apparatus according to claim 12 further comprising one or more further threads extending in parallel spaced relations for contacting the first layer at one or more respective parallel spaced locations.

22. The apparatus according to claim 12, wherein the thread is guided over the article and there is relative movement between the thread and the article.

23. An apparatus for patterning an article comprising a first layer of a first material, the apparatus comprising:
   a thread;
   at least two thread guide means for:
      mounting the thread and providing a length of the thread for contacting the article to remove at least part of the first material of the first layer; and
      guiding the thread so that the thread disengages from the article;
   means for moving the thread relative to the at least two thread guide means; and
   means for applying a solvent to the thread before the thread contacts the article, the first material being soluble in the solvent.

24. The apparatus according to claim 23, wherein the article is a web of material and the apparatus further comprises a web guide means capable of guiding the web thereabout.

25. The apparatus according to claim 24, wherein the web guide means comprises a roller.

26. The apparatus according to claim 23, wherein the at least two thread guide means are operable to bring the thread into contact with the web as the web is guided about the web guide means.

27. The apparatus according to claim 23, wherein the thread is guided over the article and there is relative movement between the thread and the article.

28. The apparatus according to claim 23, wherein the at least two thread guide means comprise a plurality of rollers for moving the thread in lengthwise direction thereof.

29. The apparatus according to claim 23, wherein the at least two thread guide means for guiding the thread comprise a groove sized so as to receive and guide the thread.

30. The apparatus according to claim 23, wherein the means for applying a solvent to the thread comprises a bath comprising the solvent.

31. The apparatus according to claim 23, wherein the thread is formed from cotton or polyester.

32. The apparatus according to claim 23, wherein the thread contains the solvent.

33. The apparatus according to claim 23 further comprising one or more further threads extending in parallel spaced relations for contacting the first layer at one or more respective parallel spaced locations.

\* \* \* \* \*